(12) United States Patent
Otsuka

(10) Patent No.: US 6,895,523 B2
(45) Date of Patent: May 17, 2005

(54) GENERATION OF PULSE SIGNALS FROM A CLOCK SIGNAL

(75) Inventor: Syuji Otsuka, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 578 days.

(21) Appl. No.: 10/005,471

(22) Filed: Nov. 6, 2001

(65) Prior Publication Data
US 2002/0083358 A1 Jun. 27, 2002

(30) Foreign Application Priority Data

Nov. 20, 2000 (JP) ........................................ 2000-352307

(51) Int. Cl.[7] .............................................. H03L 7/00
(52) U.S. Cl. ........................ 713/401; 713/400; 713/500; 713/501; 327/161; 327/276; 331/11; 369/59.22
(58) Field of Search ................................. 713/400, 401, 713/500, 501; 327/161, 276; 331/11; 369/59.22

(56) References Cited

U.S. PATENT DOCUMENTS

| | | | | |
|---|---|---|---|---|
| 5,357,196 A | * | 10/1994 | Ito | 324/166 |
| 6,373,307 B1 | * | 4/2002 | Takai | 327/161 |
| 6,526,468 B1 | * | 2/2003 | Larochelle et al. | 710/305 |
| 6,618,338 B1 | * | 9/2003 | Fujiwara et al. | 369/59.22 |
| 6,727,740 B2 | * | 4/2004 | Kirsch | 327/161 |
| 6,803,826 B2 | * | 10/2004 | Gomm et al. | 331/11 |

* cited by examiner

Primary Examiner—A. Elamin
(74) Attorney, Agent, or Firm—Bayer Weaver & Thomas LLP

(57) ABSTRACT

Two first delay signals Q30 and Q34 are generated such that edges thereof are delayed by a first delay time Td1 in relation to the rising edge of a clock signal CLK. Two second delay signals Q32 and Q36 are also generated such that edges thereof are delayed by a second delay time Td2 in relation to the trailing edge of the clock signal CLK. A pulse signal Sout is generated as a result of logic operations performed on the first delay signals Q30 and Q34 and the second delayed signals Q32 and Q36.

9 Claims, 14 Drawing Sheets

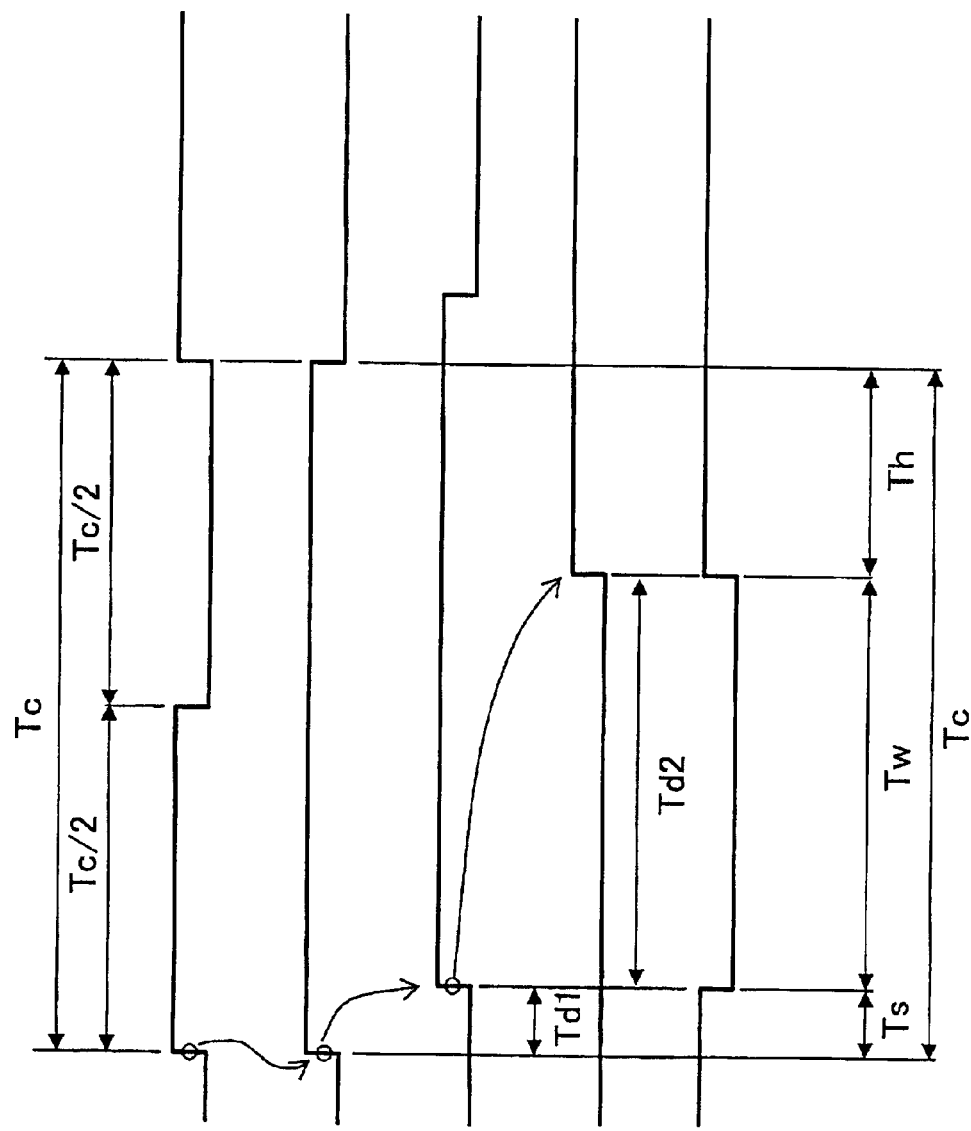

GENERATION OF PULSE SIGNALS FROM A CLOCK SIGNAL

BACKGROUND OF THE INVENTION

1. Field of the Invention

The present invention relates to a technique for generating a specific pulse signal from a clock signal having a fixed cycle.

2. Description of the Related Art

FIG. 13 is a block diagram depicting a conventional pulse signal generating circuit 200 for generating a specific pulse signal Q230 from a clock signal CLK. The circuit 200 comprises a D flip-flop 210 (henceforth referred to as "DFF 210"), two delay circuits 220 and 222 connected in series, and a NAND gate 230 in which one of the two input terminals is an inverted input terminal. The clock signal CLK is supplied to the clock input terminal of the DFF 210. The output Q210 of the DFF 210 is supplied to the first delay circuit 220, and the inverted output #Q210 is fed back to its D input terminal. The delay signal Q220 delayed by the first delay circuit 220 is supplied to the noninverted input terminal of the NAND gate 230. The delay signal Q220 is also supplied to the inverted input terminal of the NAND gate 230 after being further delayed by the second delay circuit 222.

FIGS. 14a to 14e are timing charts depicting the operation of the pulse signal generating circuit 200. The first delay signal Q220 (FIG. 14c) from the first delay circuit 220 has a rising edge that is delayed by a first delay time Td1 in relation to the rising edge of the clock signal CLK. The second delay signal Q222 (FIG. 14d) from the second delay circuit 222 has a rising edge that is further delayed by a second delay time Td2 in relation to the rising edge of the first delay signal Q220. The rising edge of the second delay signal Q222 is therefore delayed by the delay time (Td1+Td2) in relation to the rising edge of the clock signal CLK. The NAND gate 230 generates the pulse signal Q230 shown in FIG. 14e on the basis of the two delay signals Q220 and Q222.

The pulse signal Q230 may, for example, be used as a write control signal for RAM. Specifically, the pulse signal Q230 is designed as a signal that assumes an L-level for a specific period Tw during the cycle duration Tc of the clock signal CLK. A setup period Ts is provided immediately before the period Tw, and a hold period Th follows immediately behind the period Tw. Each type of RAM has its requirements for the periods Ts, Tw, and Th. Two delay times Td1 and Td2 are selected such that the periods Ts, Tw, and Th satisfy the requirements.

In this circuit design, fairly large errors are envisaged for the delay times Td1 and Td2 under consideration for the nonuniformity of delay times due to manufacturing errors, and temperature dependence. For this reason, the design of the conventional circuit shown in FIG. 13 sometimes makes it difficult to select the delay times Td1 and Td2 such that the periods Ts, Tw, and Th satisfy the requirements. A hypothetical case will now be considered in which the following conditions are selected as the requirements for the three periods Ts, Tw, and Th.

Condition C1: $Ts \geq 1$ ns;
Condition C2: $Tw \geq 10$ ns;
Condition C3: $Th \geq 3$ ns Because of the temperature dependence and manufacturing errors, the delay times Td1 and Td2 commonly vary between about 0.6 and 1.6 times the nominal value (normal value). Consequently, the maximum value of the delay times Td1 and Td2 may be as high as about 2.7 times (=1.6/0.6) of the minimum value. Taking such errors into account, it is possible to rewrite conditions C1–C3 as follows.

Condition C1a: Ts=Td1=1 ns (min) to 2.7 ns (max);
Condition C2a: Tw=Td2=10 ns (min) to 27 ns (max);
Condition C3a: $Th \geq 3$ ns In the formulas, (min) refers to conditions under which the delay times Td1 and Td2 reach their minima, and (max) refers to conditions under which the delay times Td1 and Td2 reach their maxima. Consequently, the clock cycle Tc is approximately equal to 33 ns (=2.7+27+3), which corresponds approximately to 30 MHz, under conditions in which the delay times Td1 and Td2 are both at their maxima. Meanwhile, the minimum value of the clock cycle Tc, or RAM's cycle period, as determined based on conditions C1a–C3a:, is 14 (=1+10+3) ns, which corresponds to about 71 MHz. In other words, a RAM capable of operating at about 71 MHz can operate at only about 30 MHz (about 42% of the desired speed) when the circuit shown in FIG. 13 generates write control signals.

A conventional pulse signal generating circuit is thus disadvantageous in the sense that the cycle duration of a clock signal must be set fairly low with consideration for the variations in the delay time of delay circuits in order to obtain required values for specific periods of pulse signals.

SUMMARY OF THE INVENTION

Accordingly, an object of the present invention is to provide a technique capable of yielding required values for specific periods of pulse signals without an undue reduction in the cycle duration of a clock signal, even after variations in the delay time of delay circuits are taken into account.

In order to attain at least part of the above and other related objects of the present invention, there is provided a pulse signal generating circuit for generating a specific pulse signal from a clock signal having a fixed cycle. The pulse signal generating circuit comprises an edge detector configured to detect rising and trailing edges of the clock signal, first and second delay signal generators, and a logic unit. The first delay signal generator includes at least one first delay circuit having a first delay value, and the second delay signal generator includes at least one second delay circuit having a second delay value. The first delay signal generator generates at least one first delay signal whose first delayed edge is delayed by the first delay value in relation to the rising edge of the clock signal. The second delay signal generator generates at least one second delay signal whose second delayed edge is delayed by the second delay value in relation to the trailing edge of the clock signal. The logic unit generates a pulse signal by performing logic operations on the first and second delay signals.

In the pulse signal generating circuit, the effect of variations in the delay value is less than that observed when a pulse signal is generated from only the rising edges of a clock signal. As a result, it is possible to satisfy the required values for specific periods of pulse signals without an undue reduction in the cycle duration of a clock signal, even taking into account variations in the delay value of delay circuits.

The cycle duration of a pulse signal is preferably set equal to the cycle duration of the clock signal. Adopting this approach makes it possible to minimize the effect of variations in delay values on pulse signals.

The first and second delay values may be set less than half the cycle duration of the clock signal. Adopting this approach makes it possible to reduce the delay values as such, and hence to minimize the variations in delay values caused by temperature characteristics or the like.

The first and second delay values may be equal to each other. This arrangement makes it possible to constantly preserve substantially the same period between the edge of the pulse signal determined by the first delay value and the edge of the pulse signal determined by the second delay value even when the delay values vary.

These and other objects, features, aspects, and advantages of the present invention will become more apparent from the following detailed description of the preferred embodiments with the accompanying drawings.

BRIEF DESCRIPTION OF THE DRAWINGS

FIGS. 14a–14e are timing charts depicting the operation of the conventional pulse signal generating circuit 200.

DESCRIPTION OF THE PREFERRED EMBODIMENT

Figure 1:
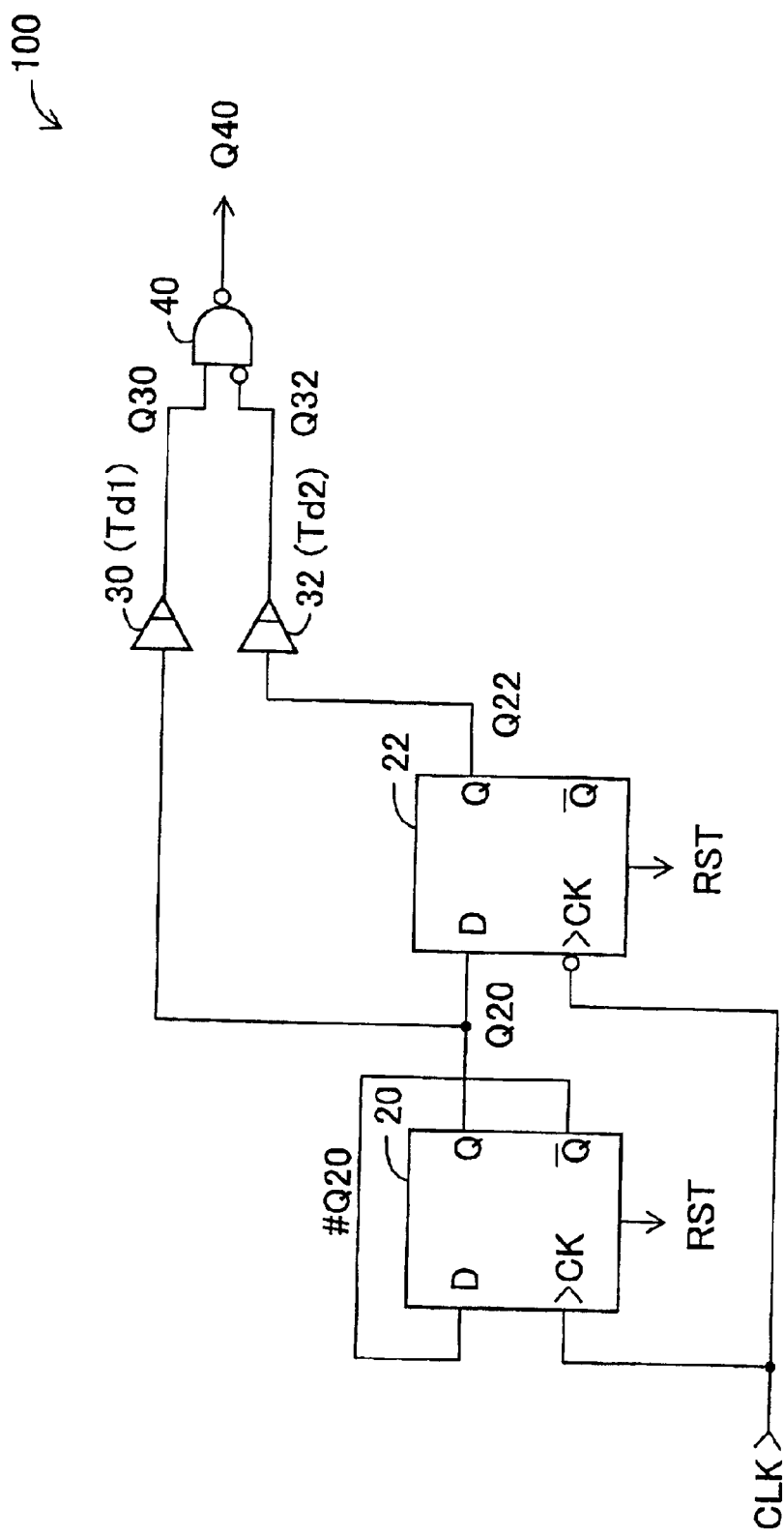
FIG. 1 is a block diagram depicting the structure of a pulse signal generating circuit 100 pertaining to a first embodiment.

Embodiments of the present invention will now be described based on embodiments in the following order.
A. First Embodiment
B. Second Embodiment
C. Third Embodiment
D. Fourth Embodiment
E. Fifth Embodiment
F. Sixth Embodiment
G. Modified Examples A. First Embodiment FIG. 1 is a block diagram depicting the structure of a pulse signal generating circuit 100 as a first embodiment of the present invention. The pulse signal generating circuit 100 comprises two D flip-flops 20 and 22, two delay circuits 30 and 32, and a NAND gate 40 in which one of the two input terminals is a noninverted input terminal. The D flip-flop will be referred to hereinbelow as "DFF." Each of the delay circuits 30 and 32 is constituted by one or more delay elements.

A clock signal CLK is supplied to the clock input terminal of the first DFF 20, and an inverted clock signal is supplied to the clock terminal of the second DFF 22. The inverted output #Q20 of the first DFF 20 is fed back to the D input terminal of the first DFF 20. The output Q20 of the first DFF 20 is supplied to the D input terminal of the second DFF 22 and to the first delay circuit 30. The output Q22 of the second DFF 22 is supplied to the second delay circuit 32. The first delay signal Q30, which is delayed by the first delay circuit 30, is supplied to the noninverted input terminal of the NAND gate 40. The second delay signal Q32, which is delayed by the second delay circuit 32, is supplied to the inverted input terminal of the NAND gate 40. The two DFFs 20 and 22 are reset in the initial state, and their outputs Q20 and Q22 are set to L-levels in this state.

FIGS. 2a–2f are timing charts depicting the operation of the pulse signal generating circuit 100 pertaining to the first embodiment. The output Q20 (FIG. 2b) of the first DFF 20 is a signal whose level is inverted by each rising edge of the clock signal CLK. The output Q22 (FIG. 2c) of the second DFF 22 is a signal whose level is inverted by each trailing edge of the clock signal CLK.

Figure 2:
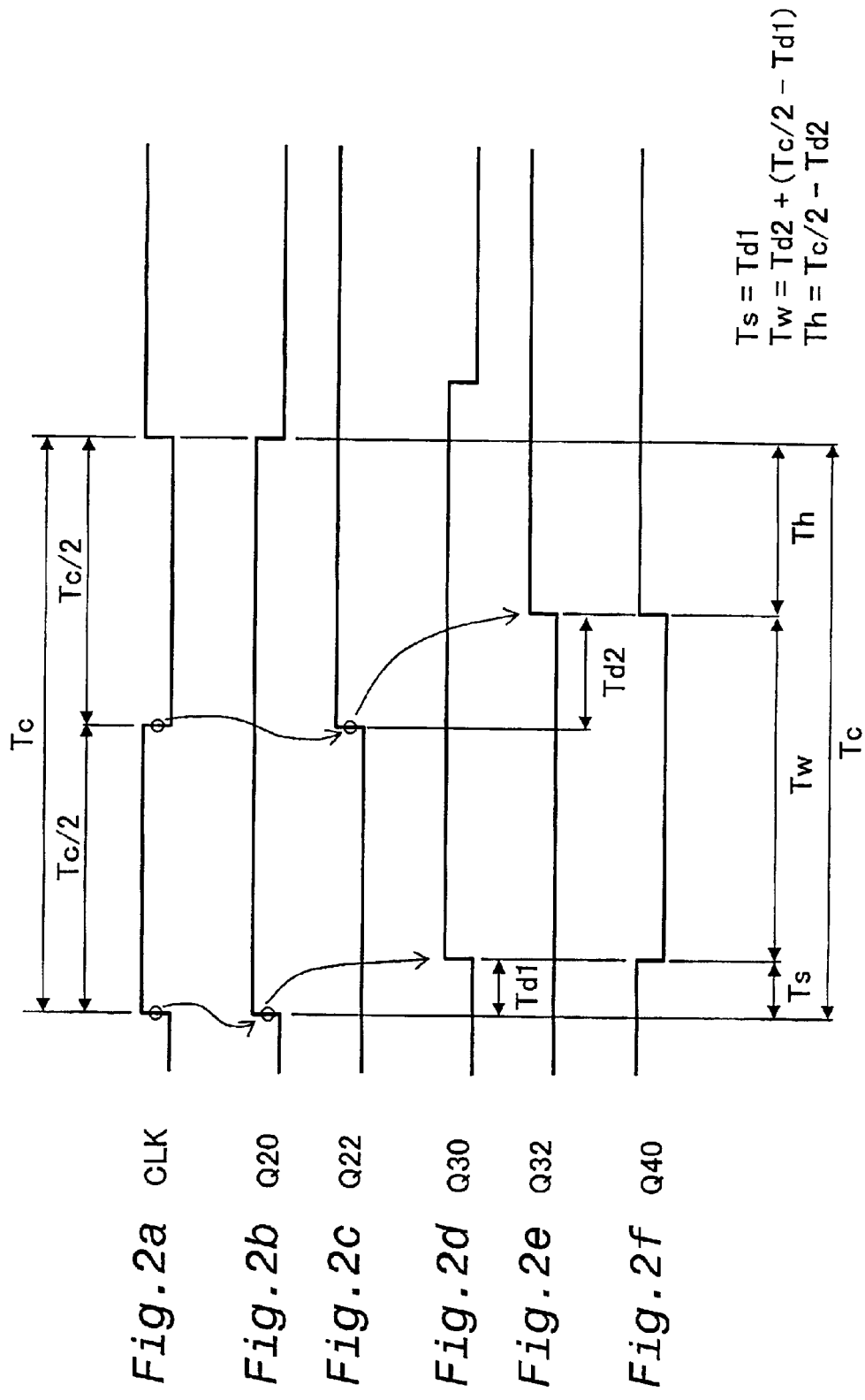
FIGS. 2a–2f are timing charts depicting the operation of the pulse signal generating circuit 100 pertaining to the first embodiment.

The output Q20 of the first DFF 20 is delayed by a first delay time Td1 with the aid of the first delay circuit 30, yielding a first delay signal Q30 (FIG. 2d). The output Q22 of the second DFF 22 is delayed by a second delay time Td2 with the aid of the second delay circuit 32, yielding a second delay signal Q32 (FIG. 2e). Specifically, the first delay signal Q30 is a signal whose edge is delayed by the first delay time Td1 in relation to the rising edge of the clock signal CLK. The second delay signal Q32 is a signal whose edge is delayed by the second delay time Td2 in relation to the trailing edge of the clock signal CLK. The NAND gate 40 generates a pulse signal Q40 (FIG. 2f) by performing logic operations on the delay signals Q30 and Q32.

The trailing edge of the pulse signal Q40 is delayed by the first delay time Td1 in relation to the rising edge of the clock signal CLK, and the rising edge of the pulse signal Q40 is delayed by the second delay time Td2 in relation to the trailing edge of the clock signal CLK. The pulse signal generating circuit 100 of the first embodiment is thus advantageous in that the effect of the delay time error on the pulse signal is minimized because the trailing and rising edges of the pulse signal Q40 are generated by delays in relation to the different edges of the same clock signal. As a result, the cycle duration Tc of the clock signal CLK can be reduced in comparison with the conventional circuits, as described below.

Figure 13:
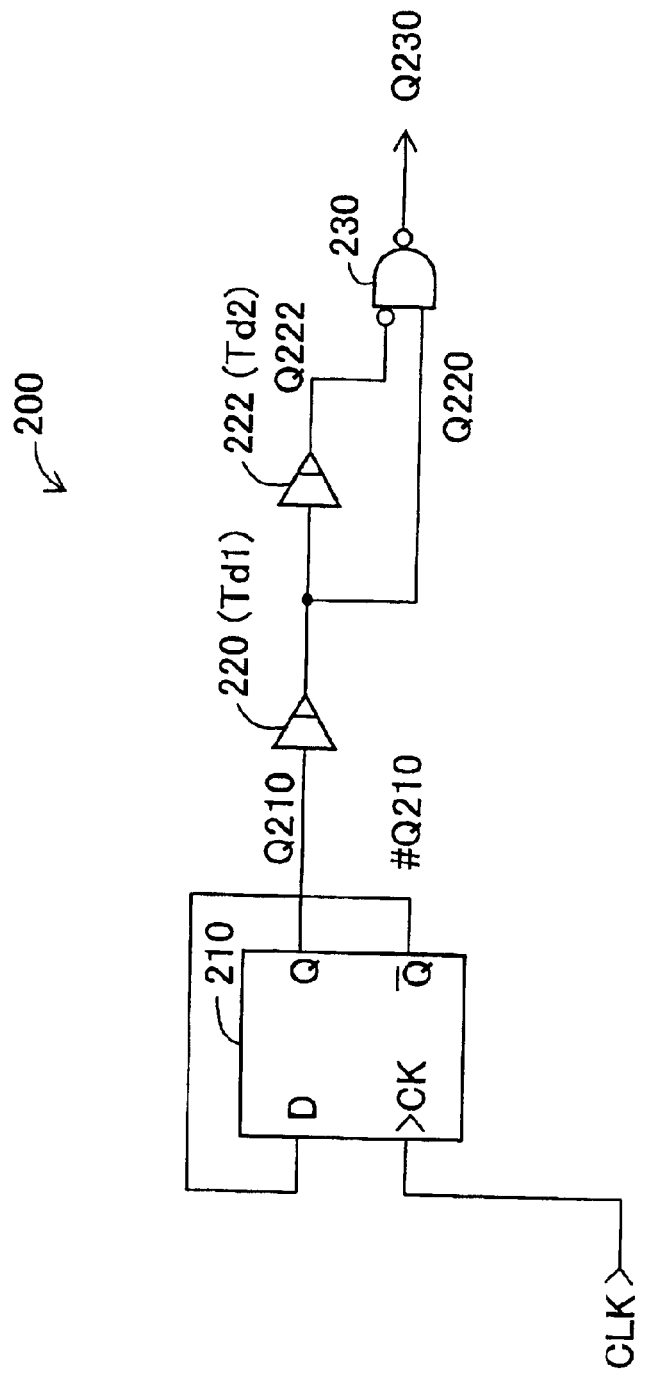
FIG. 13 is a block diagram depicting a conventional pulse signal generating circuit 200.

Similar to the example described above with reference to the conventional circuit of FIG. 13, it will be assumed herein that the following conditions C1–C3 are set for the three periods Ts, Tw, and Th of the output signal Q40 (FIG. 2f) of the NAND gate 40.

Condition C1: $Ts \geq 1$ ns;
Condition C2: $Tw \geq 10$ ns;
Condition C3: $Th \geq 3$ ns It can be seen in FIG. 2f that the periods Ts, Tw, and Th are related to the cycle duration Tc of the clock signal CLK and the delay times Td1 and Td2 by Eqs. (1) to (3).

$$Ts = Td1 \quad (1)$$

$$Tw = Td2 + Tc/2 - Td1 \quad (2)$$

$$Th = Tc/2 - Td2 \quad (3)$$

In this case, conditions C1–C3 can be rewritten as conditions C4–C6.

Condition C4: $Ts = Td1 \geq 1$ ns
Condition C5: $Tw = Td2 + Tc/2 - Td1 \geq 10$ ns
Condition C6: $Th = Tc/2 - Td2 \geq 3$ ns It is assumed herein that the maximum value Td1max of the first delay time Td1 is 2.7 times its minimum value Td1min, and the maximum value Td2max of the second delay time Td2 is 2.7 times its minimum value Td2min. It is also assumed that one of the two delay times Td1 and Td2 is at its minimum when the other is at its minimum, and at its maximum when the other is at its maximum. The latter assumption is made taking into account that the effect of the temperature dependence of the delay circuits 30 and 32 is factored into the maximum or minimum value of a delay time. Specifically, it is appropriate to abandon the premise that one of the delay circuits is brought to its minimum by the temperature dependence when the other delay circuit is brought to its maximum by the temperature dependence, and it is therefore assumed that both elements reach their maxima or minima at the same time.

Condition C4 is the most rigorous when the first delay time Td1 assumes its minimum value Td1min. Condition C6 is the most rigorous when the second delay time Td2 assumes its maximum value Td2max (=2.7×Td2min). Conditions C4–C6 can therefore be rewritten as conditions C4a–C6a.

Condition C4a: $Ts = Td1min > 1$ ns
Condition C5a: $Tw = Td2 + Tc/2 - Td1 \geq 10$ ns
Condition C6a: $Th = Tc/2 - 2.7 \times Td2min \geq 3$ ns It is assumed herein that the period Tw is equal to 10 ns when the delay times Td1 and Td2 assume their minimum values Td1min and Td2min, respectively. The following relations (4) to (6) hold in this case.

$$Td1min \geq 1 \text{ ns} \quad (4)$$

$$Td2min + Tc/2 - Td1min = 10 \text{ ns} \quad (5)$$

$$Tc/2 - 2.7 \times Td2min \geq 3 \text{ ns} \quad (6)$$

When the relation (5) is substituted into the relation (4), the following relation (7) is obtained.

$$Td2min + Tc/2 \geq 11 \text{ ns} \quad (7)$$

When the relations (6) and (7) are solved for Tc, the following relation (8) is obtained.

$$Tc \geq 17.7 \text{ ns} \quad (8)$$

Assuming that Td1min=1 ns and Tc=17.7 ns. In this case, Td2min is 2.15 ns from the relation (5). It can easily be confirmed that the aforementioned conditions C4–C6 are met when Tc=17.7 ns, Td1=Td1min 1 ns, and Td2=Td2min=2.15 ns.

The maximum values Td1max and Td2max of the delay times Td1 and Td2 are 2.7 times the minimum values Td1min and Td2min, respectively, amounting to 2.7 ns and 5.8 ns, respectively. In other words, it can be confirmed that the aforementioned conditions C4–C6 are met even under the maximum-value conditions, which are Tc=17.7 ns, Td1=Td1max=2.7 ns, and Td2=Td2max=5.8 ns. Consequently, the required values for the periods Ts, Tw, and Th of the pulse signal Q40 can be maintained by setting the cycle duration Tc to 17.7 ns (56.6 MHz) even when the delay times Td1 and Td2 vary.

The minimum value of the cycle duration Tc determined by the aforementioned conditions C1–C3 is 14 (=1+10+3) ns, which corresponds to about 71 MHz. By contrast, the present embodiment allows the clock cycle to be set to 17.7 ns (56.5 MHz) even when the delay times vary. For example, the system can be operated at a frequency that is about 80% of the maximum permissible operating frequency (71 MHz) of RAM when the pulse signal Q40 is used as a write control signal for the RAM. By contrast, the operation of the conventional circuit shown in FIG. 13 is limited to a frequency (30 MHz) that is about 42% of the maximum permissible operating frequency of RAM, as described before. In other words, the circuit of the first embodiment can generate pulse signals whose frequency is about 1.9 times the frequency of the conventional circuit shown in FIG. 13.

It follows from the above description that the circuit of the first embodiment can provide the required values for specific periods of the pulse signal Q40 without unduly reducing the cycle duration Tc even after variations in the delay times Td1 and Td2 of the delay circuits 30 and 32 are taken into account.

The delay times Td1 and Td2 are preferably set to values less than half the clock cycle Tc. The reasons for this are as follows. The trailing edge of the pulse signal Q40 occurs following the trailing edge of the clock signal CLK when the delay time Td1 is more than half the clock cycle Tc. It is therefore possible in this case to generate the trailing edge of the pulse signal Q40 from the trailing edge of the clock signal CLK. In other words, it is possible to calculate a desired time period (Td1−Tc/2) by subtracting half the cycle Tc/2 of the clock signal from the delay time Td1, and to generate the trailing edge of the pulse signal Q40 delayed by this time (Td1−Tc/2) from the trailing edge of the clock signal CLK, in place of setting the delay time Td1 more than half the clock cycle Tc. An advantage of this method is that a varying delay time has a lesser effect than when the delay time Td1 is more than half the clock cycle Tc. Consequently, the delay times Td1 and Td2 of the circuit shown in FIG. 1 should preferably be set to a value less than half the clock cycle Tc.

Figure 3:
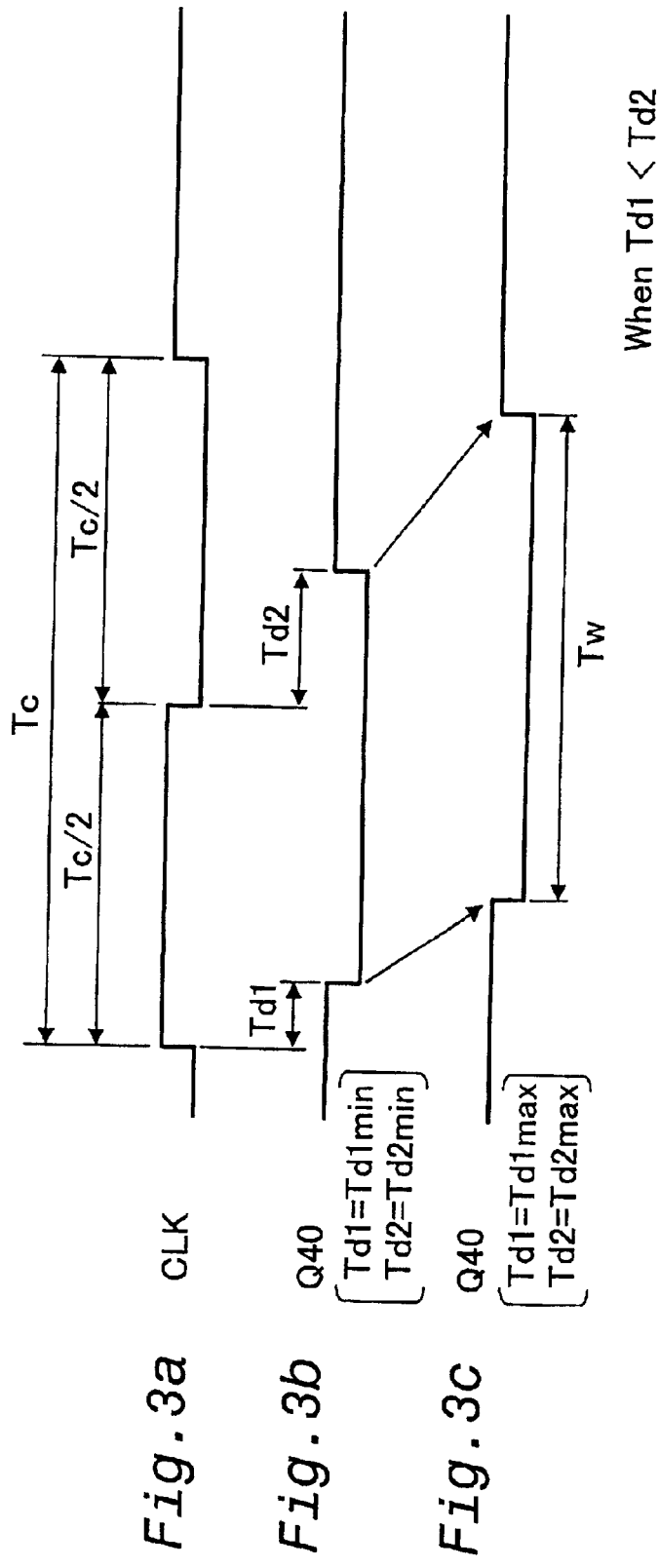
FIGS. 3a–3c are diagrams showing a comparison between cases in which the delay times are at their minima and maxima when the first delay time Td1 is less than the second delay time Td2.

The L-level period Tw of the pulse signal Q40 varies with the variations of the delay times Td1 and Td2, but the manner in which the signal varies depends on the dimensional relationship between the two delay times Td1 and Td2. FIGS. 3a–3c are diagrams showing a comparison between cases in which the delay times Td1 and Td2 are at their respective minima (FIG. 3b) and maxima (FIG. 3c) when the first delay time Td1 is less than the second delay time Td2. It can be seen that the period Tw is longer for the maximum values of the delay times than for the minimum values thereof when the first delay time Td1 is less than the second delay time Td2.

Figure 4:
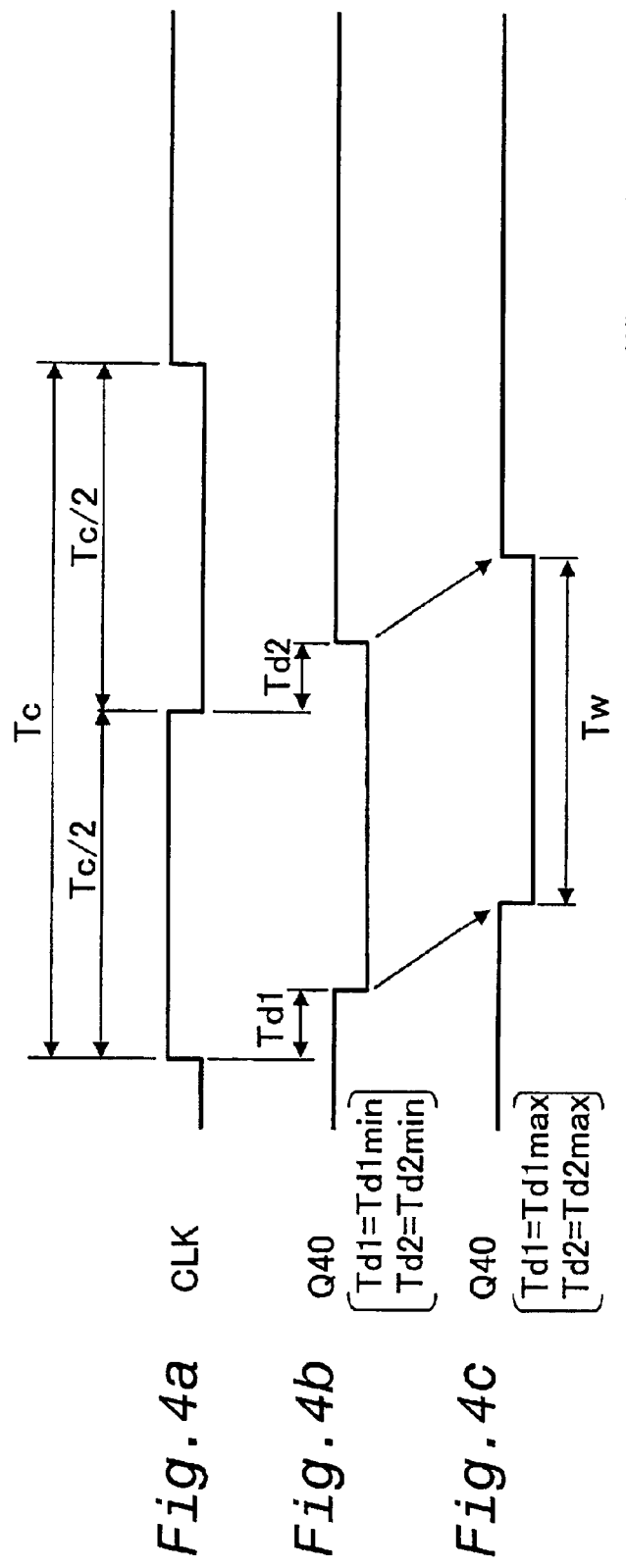
FIGS. 4a–4c are diagrams showing a comparison between cases in which the delay times are at their minima and maxima when the first and second delay times Td1 and Td2 are equal to each other.

FIGS. 4a–4c are diagrams showing a comparison between cases in which the delay times Td1 and Td2 are at their respective minima and maxima when the first and second delay times Td1 and Td2 are equal to each other. The length of the period Tw remains constant despite variations in the delay times when the two delay times Td1 and Td2 are equal to each other.

Figure 5:
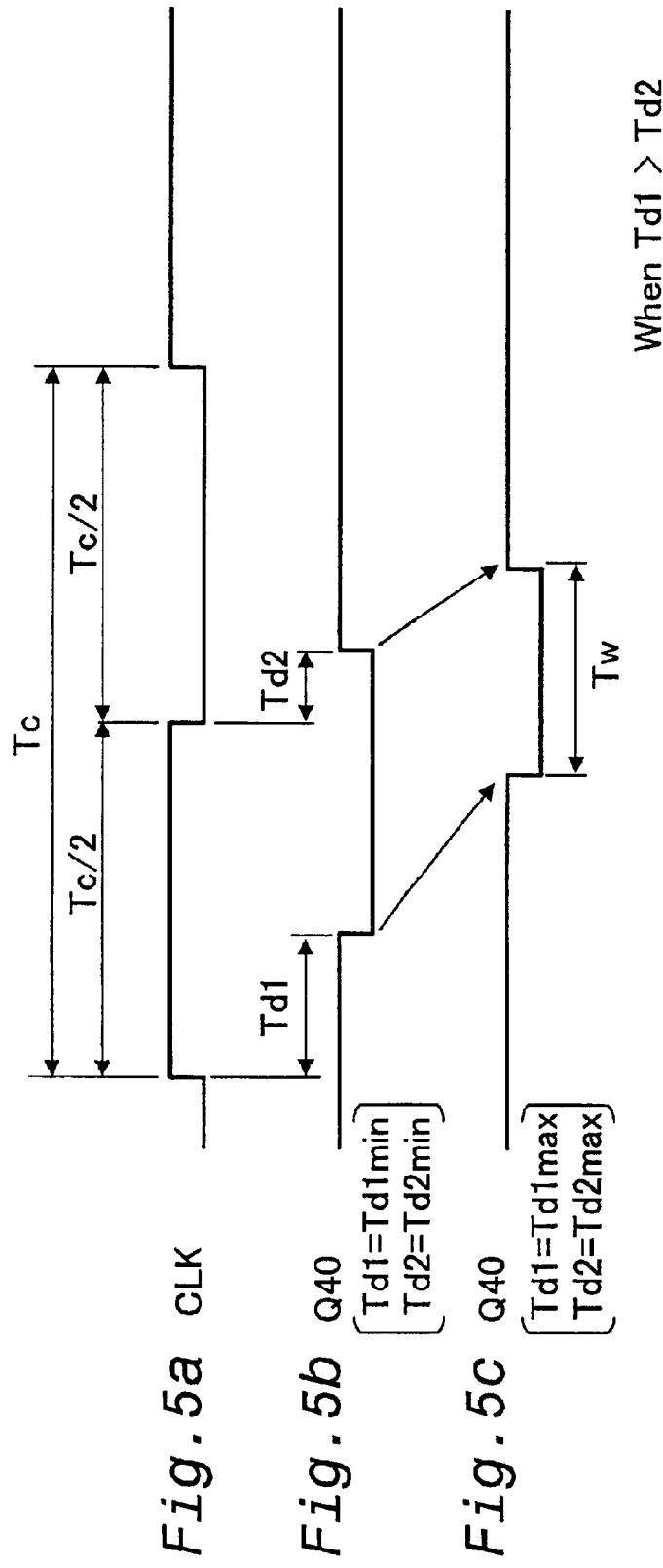
FIGS. 5a–5c are diagrams showing a comparison between cases in which the delay times are at their minima and maxima when the first delay time Td1 is greater than the second delay time Td2.

FIGS. 5a–5c are diagrams showing a comparison between cases in which the delay times Td1 and Td2 are at their respective minima and maxima when the first delay time Td1 is greater than the second delay time Td2. The period Tw is shorter for the maximum values of the delay times than for the minimum values thereof when the first delay time Td1 is less than the second delay time Td2.

Thus, the manner in which variations in the delay times Td1 and Td2 affect the length of the period Tw (that is, the period between a delayed edge obtained by delaying the rising edge of a clock signal and a delayed edge obtained by delaying the trailing edge thereof) depends on the dimensional relationship between the delay times Td1 and Td2. Consequently, the dimensional relationship between the delay times Td1 and Td2 should preferably be set in an appropriate manner in accordance with the conditions for the required values of the period Tw. For example, equal values should preferably be selected for the delay times Td1 and Td2 in order to keep the length of the period Tw substantially constant at all times.

Figure 6:
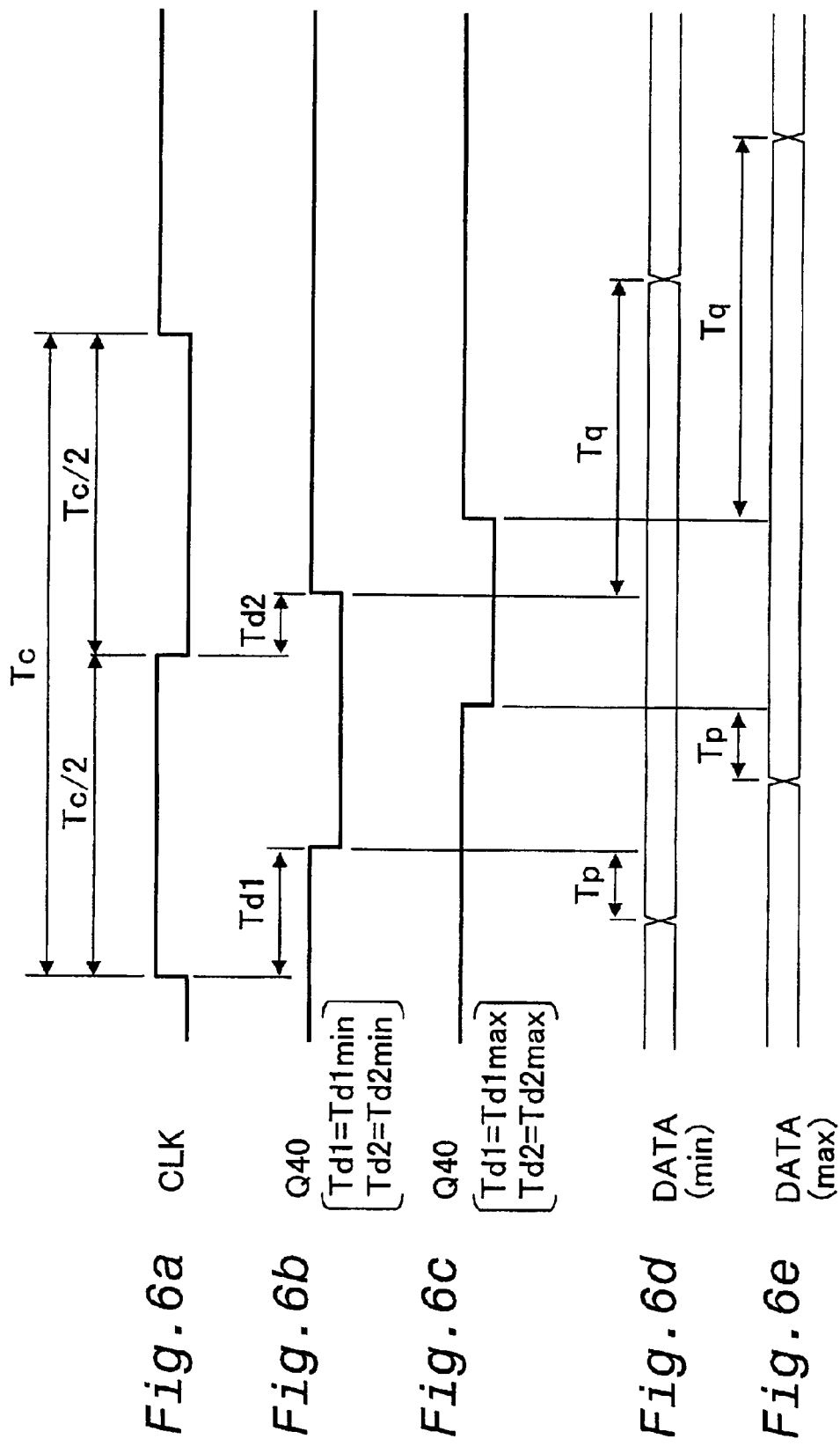
FIGS. 6a–6e are diagrams depicting an example in which a pulse signal Q40 is used for transmitting data over an external bus.

The pulse signal Q40 can be used not only for the write control of RAM but in other applications as well. FIGS. 6a–6e are diagrams depicting an example in which a pulse signal Q40 is used as a strobe pulse for transmitting data over a data bus. FIG. 6b depicts the pulse signal Q40 existing under conditions in which the delay times Td1 and Td2 are at their minima, and FIG. 6d depicts the timing of a data signal transmitted over a data bus in these conditions. FIG. 6c depicts the pulse signal Q40 existing under conditions in which the delay times Td1 and Td2 are at their maxima, and FIG. 6e depicts the timing of a data signal transmitted over a data bus in these conditions.

It can be seen in these examples that when the delay times Td1 and Td2 vary due to their temperature dependence, and the timing of the pulse signal Q40 varies in a corresponding manner, the timing of a data signal transmitted over a data bus varies according to the same trend. Specifically, the period Tp between the turning point of a data signal and the trailing edge of the pulse signal Q40 is kept at a certain length despite the temperature dependence, as is the period Tq between the rising edge of the pulse signal Q40 to the turning point of the data signal. Data can therefore be securely transmitted by using the pulse signal Q40 as a strobe pulse even when the timing of the delay signal is varied by the temperature dependence. In addition, data can be rapidly transmitted because the circuit 100 of the first embodiment allows the frequency of the pulse signal Q40 to be set to a higher level than in the prior art circuitry, as described above.

B. Second Embodiment

Figure 7:
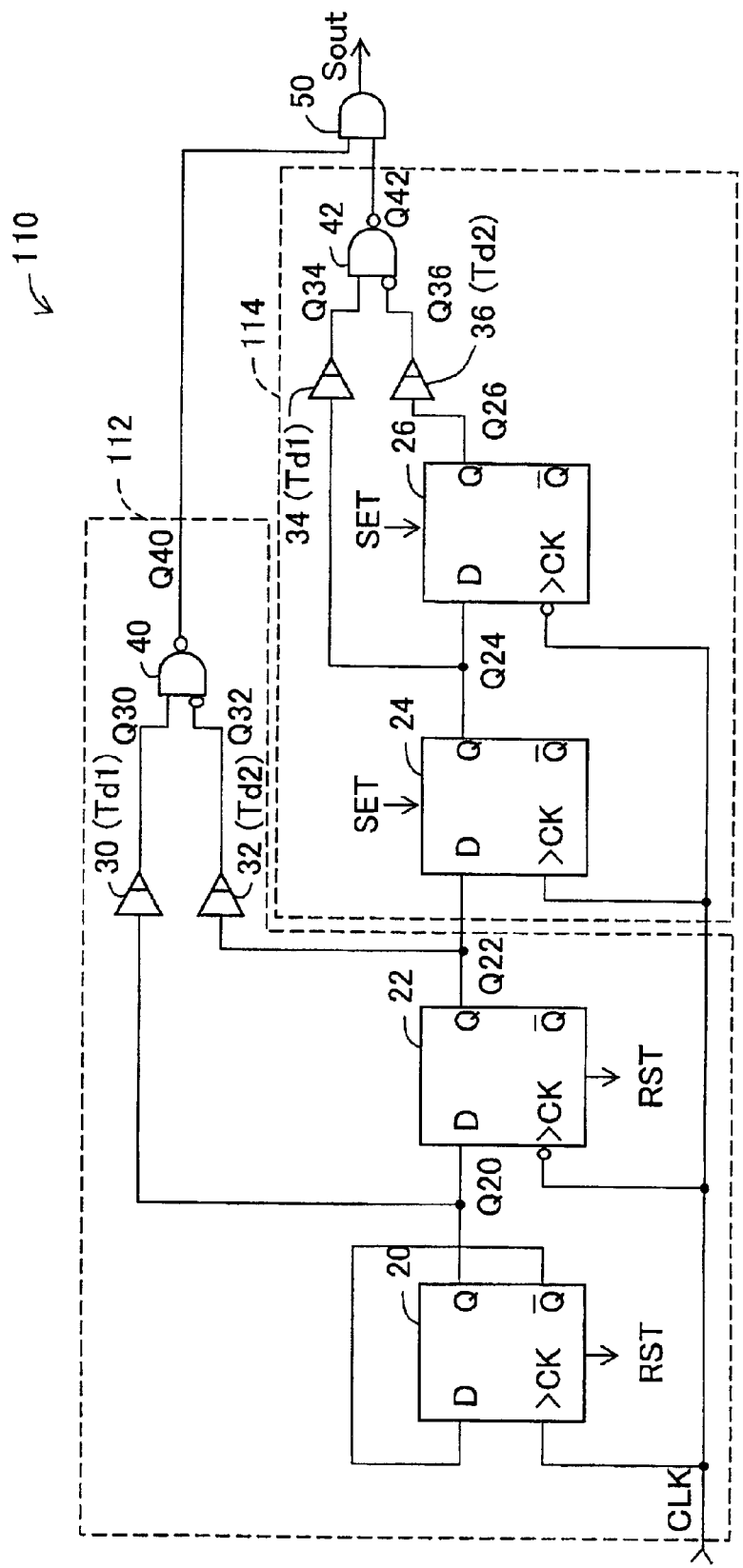
FIG. 7 is a block diagram depicting the structure of a pulse signal generating circuit 110 pertaining to a second embodiment.

FIG. 7 is a block diagram depicting the structure of a pulse signal generating circuit 110 as a second embodiment of the present invention. The circuit 110 comprises a first-stage circuit 112, a second-stage circuit 114, and an AND gate 50. The first-stage circuit 112 has the same structure as the pulse signal generating circuit 100 of the first embodiment shown in FIG. 1. The second-stage circuit 114 comprises two DFFs 24 and 26, two delay circuits 34 and 36, and a NAND gate 42 in which one of the two input terminals is an inverted input terminal. The connections between the elements of the second-stage circuit 114 are substantially the same as the connections between the elements of the first-stage circuit 112. The delay circuits 34 and 36 in the second-stage circuit 114 have the same delay times Td1 and Td2 as the delay circuits 30 and 32 in the first-stage circuit 112. The D input terminal of the first DFF 24 in the second-stage circuit 114 is supplied with the output Q22 from the second DFF 22 of the first-stage circuit 112. Unlike the output provided by the first DFF 20 of the first-stage circuit 112, the inverted output provided by the first DFF 24 of the second-stage circuit 114 is not fed back to the D input terminal of the DFF 24. The two DFFs 24 and 26 in the second-stage circuit 114 are set in the initial state, so the outputs Q24 and Q26 thereof are at H-levels in this state. The AND gate 50 generates a final pulse signal Sout by performing logic operations on the outputs Q40 and Q42 of the first-stage circuit 112 and second-stage circuit 114 (that is, the outputs of the two NAND gates 40 and 42).

Figure 8:
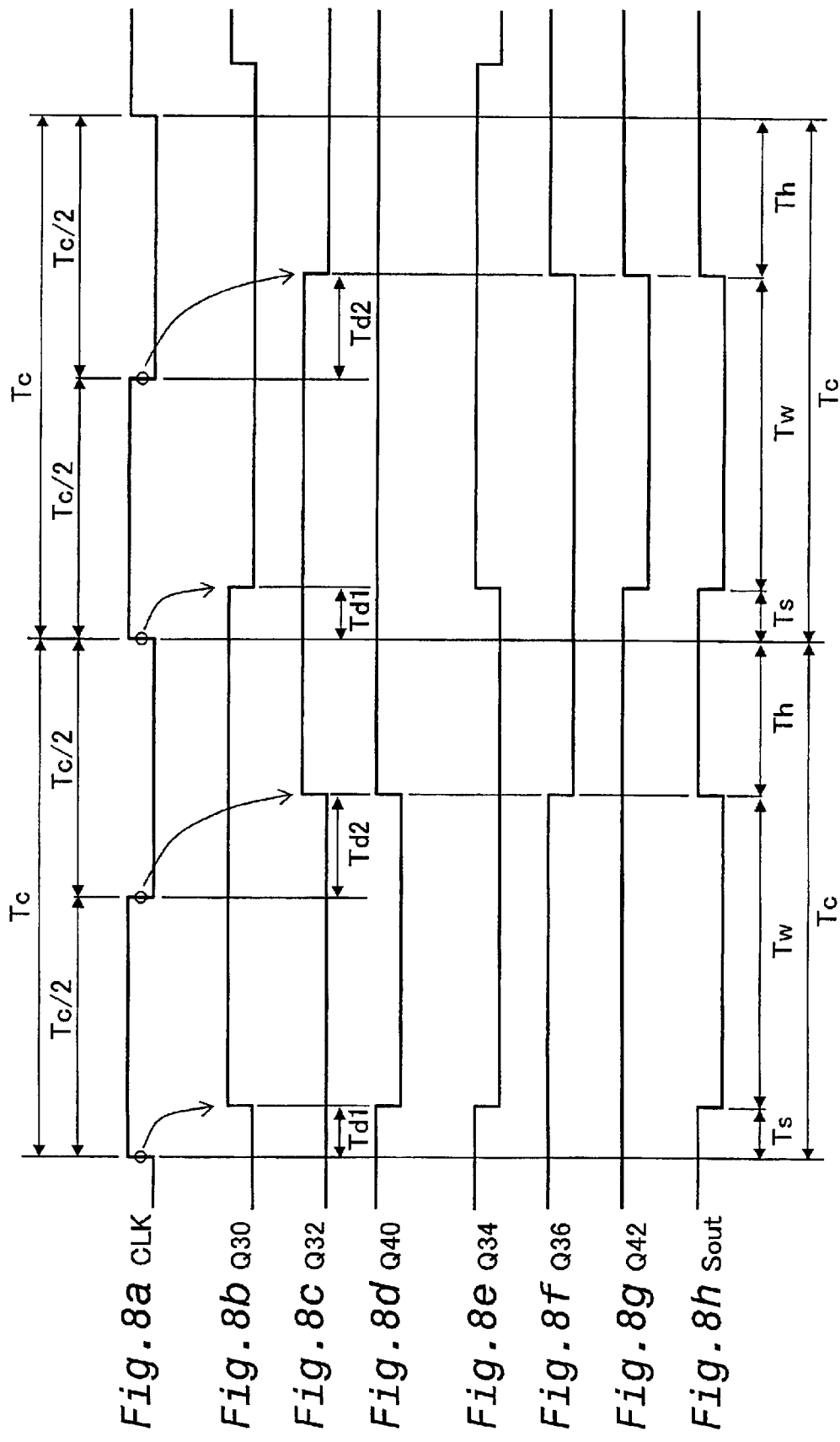
FIGS. 8a–8h are timing charts depicting the operation of the pulse signal generating circuit 110 pertaining to the second embodiment.

FIGS. 8a–8h are timing charts depicting the operation of the pulse signal generating circuit 110 pertaining to the second embodiment. The signals CLK, Q30, Q32, and Q40 shown in FIGS. 8a, 8b, 8c, and 8d are those of the first-stage circuit 112, and are identical to the signals shown with reference to the first embodiment in FIGS. 2a, 2d, 2e, and 2f, respectively. The signals Q34, Q36, and Q42 shown in FIGS. 8e, 8f, and 8g are those of the second-stage circuit 114, and are obtained by shifting each of the signals Q30, Q32, and Q40 in the first-stage circuit 112 backward by the clock cycle Tc. For example, the output Q40 of the first-stage circuit 112 corresponds to the final pulse signal Sout during odd-numbered clock cycles, and the output Q42 of the second-stage circuit 114 corresponds to the final pulse signal Sout during even-numbered clock cycles. The pulse signal Sout output by the AND gate 50 is generated by performing logic operations on the outputs Q40 and Q42 such that L-levels are maintained while at least one of the outputs Q40 and Q42 is at the L-level. As a result, the pulse signal Sout has an L-level period Tw during each clock cycle Tc.

The pulse signal generating circuit 110 of the second embodiment can generate a pulse signal Sout whereby a single L-level period Tw appears during each cycle Tc of the clock signal CLK. Inverting the pulse signal Sout will create a pulse signal whereby a single H-level period Tw appears during each cycle Tc of the clock signal CLK. The pulse signal generating circuit 110 of the second embodiment can therefore generate a pulse signal Sout whereby a single period Tw with a specific logic level appears during each cycle Tc of the clock signal CLK.

Correctly speaking, the above-described calculation of the operating frequency of a RAM in accordance with the first embodiment applies to the pulse signal generating circuit 110 of the second embodiment described with reference to FIG. 7 because the first embodiment does not produce a pulse signal having an L-level period Tw during each cycle Tc. However, the pulse signal generating circuit 100 of the first embodiment is also similar in the sense of being able to generate a pulse signal whose frequency is about 1.9 times the frequency of the conventional circuit shown in FIG. 13. It should be noted that he pulse signal generating circuit 110 of the second embodiment can generate a pulse signal whose frequency is twice the frequency generated by the pulse signal generating circuit 100 of the first embodiment.

C. Third Embodiment

Figure 9:
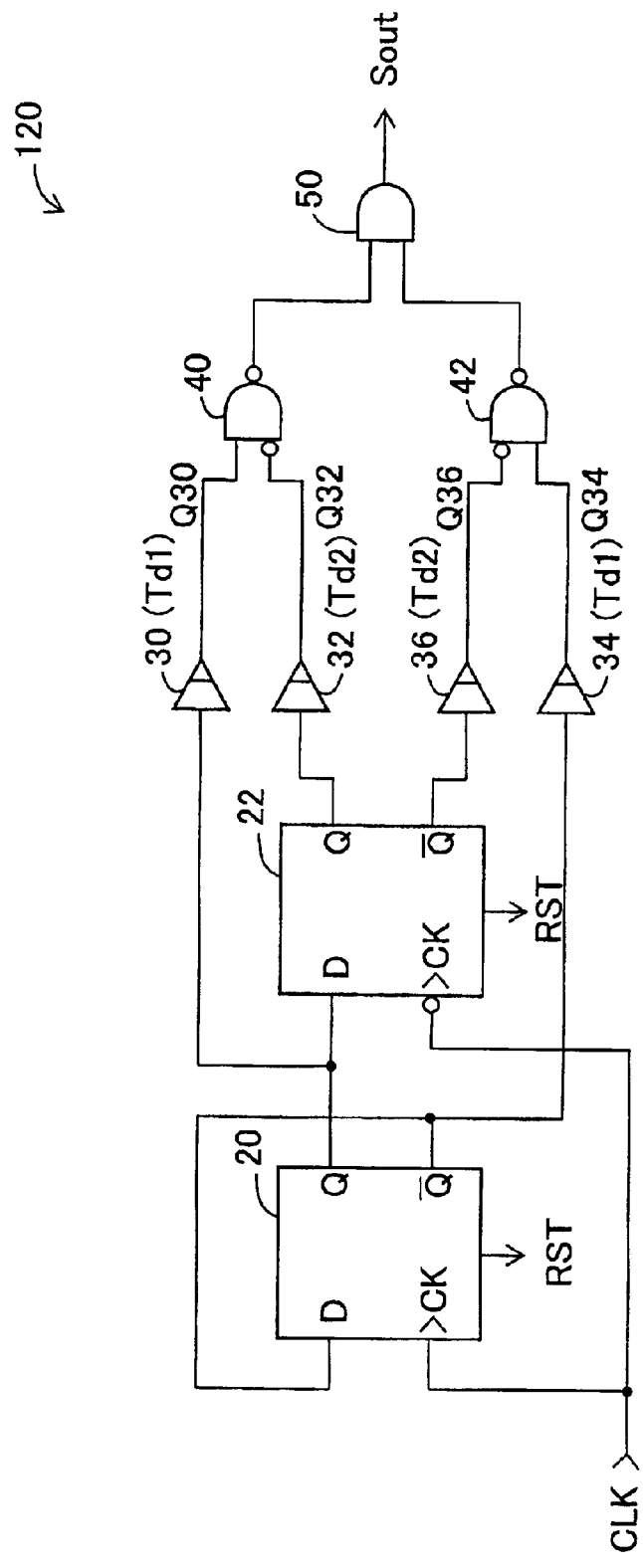
FIG. 9 is a block diagram depicting a pulse signal generating circuit 120 pertaining to a third embodiment.

FIG. 9 is a block diagram depicting a pulse signal generating circuit 120 pertaining to a third embodiment of the present invention. The pulse signal generating circuit 120 is obtained by removing the two DFFs 24 and 26 from the circuit of the second embodiment shown in FIG. 7. Another feature of the circuit 120 is that the inputs of the delay circuits 34 and 36 are different from those of the circuit pertaining to the second embodiment. Specifically, the inverted output of the first DFF 20 is provided to a delay circuit 34 having a first delay time Td1, and the inverted output of the second DFF 22 is provided to a delay circuit 36 having a second delay time Td2.

The pulse signal generating circuit 120 of the third embodiment can generate substantially the same pulse signal Sout as the pulse signal generating circuit 110 of the second embodiment. Another advantage of the third embodiment is that its circuit structure is simpler than that of the second embodiment.

D. Fourth Embodiment

Figure 10:
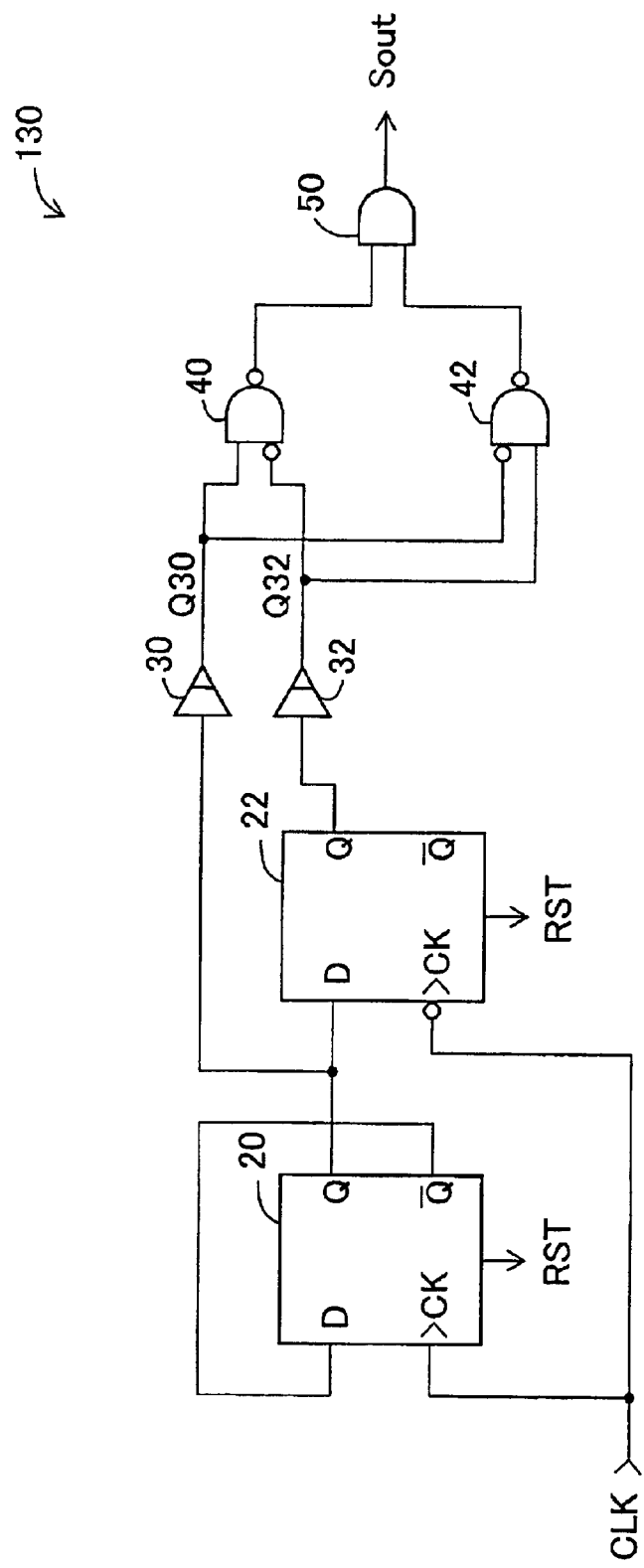
FIG. 10 is a block diagram depicting the structure of a pulse signal generating circuit 130 pertaining to a fourth embodiment.

FIG. 10 is a block diagram depicting the structure of a pulse signal generating circuit 130 pertaining to a fourth embodiment of the present invention. The structure of the pulse signal generating circuit 130 is obtained by removing the two delay circuits 34 and 36 from the circuit of the third embodiment shown in FIG. 9. Another feature of the pulse signal generating circuit 130 is that the output Q30 of the first delay circuit 30 is provided to the noninverted input terminal of a first NAND gate 40 and the inverted input terminal of a second NAND gate 42. The output Q32 of the second delay circuit 32 is provided to the inverted input terminal of the first NAND gate 40 and the noninverted input terminal of the second NAND gate 42.

The pulse signal generating circuit 130 of the fourth embodiment can generate substantially the same pulse signal Sout as the one generated by the pulse signal generating circuit of the second or third embodiment. Another advantage of the fourth embodiment is that its circuit structure is simpler than that of the third embodiment.

E. Fifth Embodiment

Figure 11:
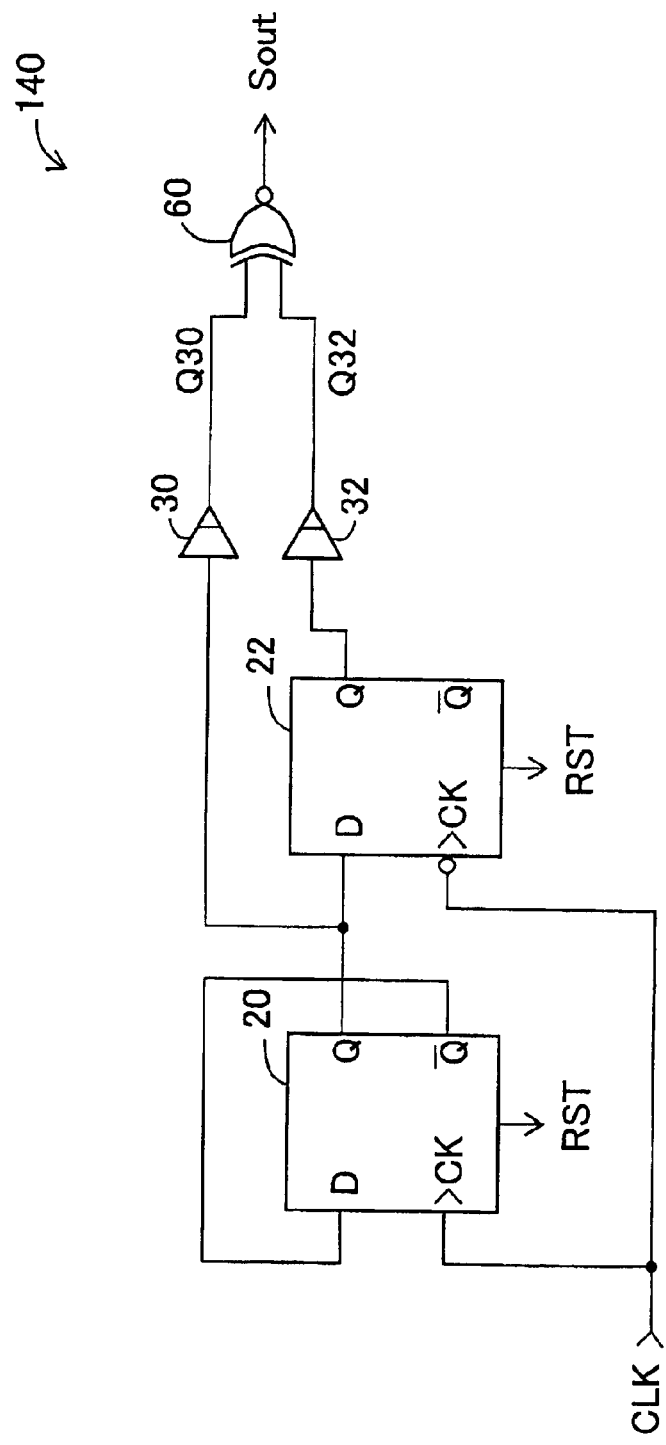
FIG. 11 is a block diagram depicting the structure of a pulse signal generating circuit 140 pertaining to a fifth embodiment.

FIG. 11 is a block diagram depicting the structure of a pulse signal generating circuit 140 pertaining to a fifth embodiment of the present invention. The pulse signal generating circuit 140 is obtained by substituting a single EXNOR gate 160 for the AND gate 50 and the two NAND gates 40 and 42 of the circuit pertaining to the forth embodiment shown in FIG. 10. The pulse signal generating circuit 140 of the fifth embodiment can generate substantially the same pulse signal Sout as the pulse signal generating circuits of the second to fourth embodiments.

F. Sixth Embodiment

Figure 12:
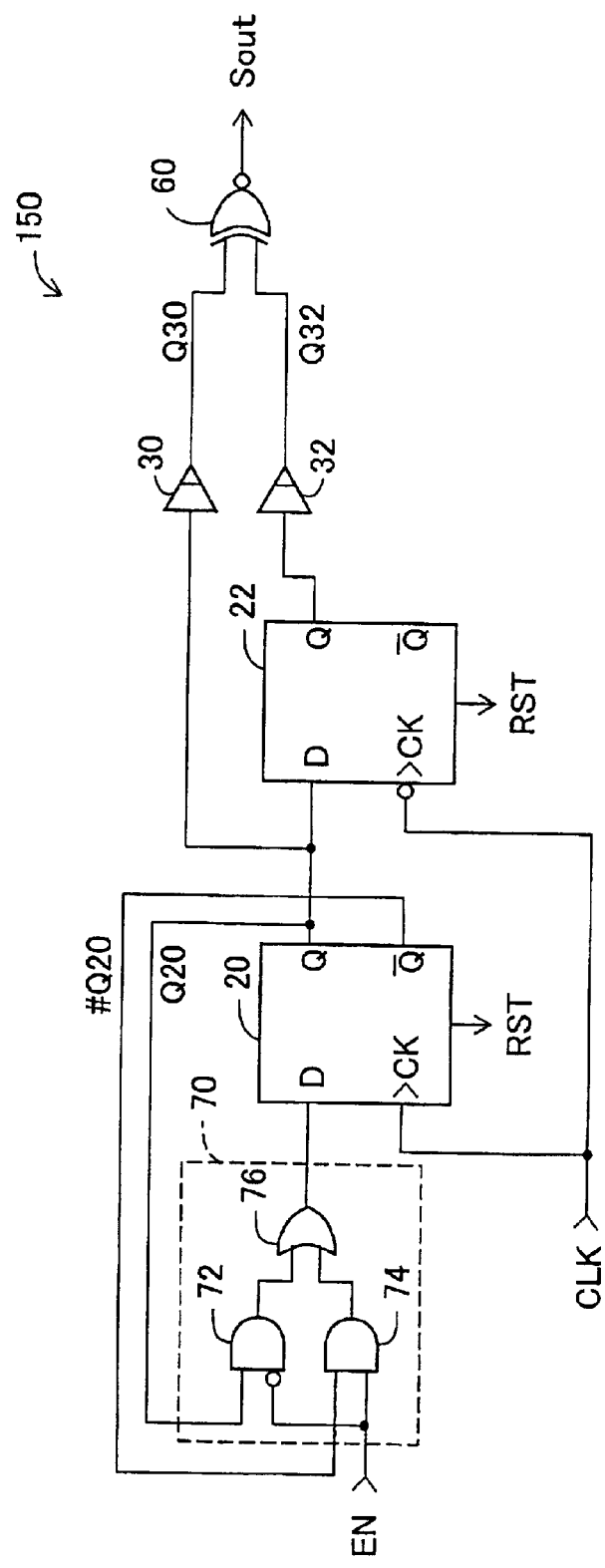
FIG. 12 is a block diagram depicting the structure of a pulse signal generating circuit 150 pertaining to a sixth embodiment.

FIG. 12 is a block diagram depicting the structure of a pulse signal generating circuit 150 pertaining to a sixth embodiment of the present invention. The pulse signal generating circuit 150 is obtained by adding an enable control circuit 70 to the fist stage of the first DFF 20 in the circuit of the fifth embodiment shown in FIG. 11. The enable control circuit 70 comprises two AND gates 72 and 74, and an OR gate 76. One of the two input terminals of the first AND gate 72 is an inverted input terminal.

A common enable signal EN provided from external circuitry is supplied to the inverted input terminal of the first AND gate 72 and one of the input terminals of the second AND gate 74. The output Q20 of the first DFF 20 is supplied to the other input terminal of the first AND gate 72. The inverted output #Q20 of the first DFF is supplied to the other input terminal of the second AND gate 74. The outputs of the two AND gates 72 and 74 are supplied to the OR gate 76, and the output of the OR gate 76 is supplied to the D input terminal of the first DFF.

The operation of the pulse signal generating circuit 150 is enabled by the level of the enable signal EN. Specifically, the pulse signal generating circuit 150 is rendered inoperative and the pulse signal Sout is kept at an L-level when the enable signal EN is at an L-level. The pulse signal generating circuit 150 generates the pulse signal Sout shown in FIG. 8h above when the enable signal EN is at a H-level.

It can be seen from the above embodiments that various circuit structures can be adopted for the pulse signal generating circuit of the present invention, and additional circuits can be employed in order to perform functions other than those required to generate pulse signals.

G. Modified Examples

G1. Modified Example 1

Although the above embodiments are described with reference to cases in which a plurality of D flip-flops are used as the edge detector circuits for detecting the edges of clock signals, it is also possible to construct the edge detector circuits by making use of circuit elements other than D flip-flops.

G2. Modified Example 2

Although the above embodiments are described with reference to cases in which pulse signals are generated such that they remained at an L-level for a given period Tw during a single cycle of a clock signal CLK, the present invention can also be implemented as circuits for generating other types of pulse signals.

G3. Modified Example 3

The circuit of the second embodiment (FIG. 7) or third embodiment (FIG. 8) generates two first delay signals Q30 and Q34 whose edges are delayed by a first delay time Td1 in relation to the rising edge of a clock signal, and two second delay signals Q32 and Q36 whose edges are delayed by a second delay time Td2 in relation to the trailing edge of the clock signal. By contrast, the circuit of the first embodiment (FIG. 1), fourth embodiment (FIG. 10), fifth embodiment (FIG. 11), or sixth embodiment (FIG. 12) generates a single first delay signal Q30 and a single second delay signal Q32. It can thus be concluded that the circuit of the present invention generates at least one first delay signal whose edge is delayed by a first delay value in relation to the rising edge of a clock signal, and at least one second delay signal whose edge is delayed by a second delay value in relation to the trailing edge of the clock signal. A pulse signal is generated by performing logic operations at least on the first and second delay signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pulse signal generating circuit for generating a specific pulse signal from a clock signal having a fixed cycle, comprising:
    an edge detector configured to detect rising and trailing edges of the clock signal;
    a first delay signal generator, including at least one first delay circuit having a first delay value, the first delay signal generator being configured to generate at least one first delay signal whose first delayed edge is delayed by the first delay value in relation to the rising edge of the clock signal;
    a second delay signal generator including at least one second delay circuit having a second delay value, the second delay signal generator being configured to generate at least one second delay signal whose second delayed edge is delayed by the second delay value in relation to the trailing edge of the clock signal; and
    a logic unit configured to generate a pulse signal by performing logic operations on the first and second delay signals.

2. A pulse signal generating circuit as defined in claim 1, wherein a cycle duration of the pulse signal is set equal to a cycle duration of the clock signal.

3. A pulse signal generating circuit as defined in claim 1, wherein the first and second delay values are each set less than half a cycle duration of the clock signal.

4. A pulse signal generating circuit as defined in claim 1, the first and second delay values are equal to each other.

5. A pulse signal generating circuit as defined in claim 1, wherein the edge detector comprises:

a first D flip-flop having a first clock input terminal, a first D input terminal, a first non-inverted output terminal, and a first inverted output terminal, the clock signal being supplied to the first clock input terminal, an inverted output from the first inverted output terminal being fed back to the first D input terminal; and a second flip-flop having a second clock input terminal, a second D input terminal, a second non-inverted output terminal, and a second inverted output terminal, an inverted signal of the clock signal being supplied to the second clock input terminal, an output from the first non-inverted output terminal of the first D flip-flop being supplied to the second D input terminal, wherein an output from the first output terminal of the first D flip-flop is supplied to the first delay circuit, and an output from the second output terminal of the second D flip-flop is supplied to the second delay circuit.

6. A method for generating a specific pulse signal from a clock signal having a fixed cycle, comprising the steps of:

(a) detecting rising and trailing edges of the clock signal;

(b) generate at least one first delay signal whose first delayed edge is delayed by a first delay value in relation to the rising edge of the clock signal;

(c) generating at least one second delay signal whose second delayed edge is delayed by a second delay value in relation to the trailing edge of the clock signal; and (d) generating a pulse signal by performing logic operations on the first and second delay signals.

7. A method as defined in claim 6, wherein a cycle duration of the pulse signal is set equal to a cycle duration of the clock signal.

8. A method as defined in claim 6, wherein the first and second delay values are each set less than half a cycle duration of the clock signal.

9. A method as defined in claim 6, the first and second delay values are equal to each other.

* * * * *